United States Patent
Schwarzenbach et al.

(10) Patent No.: US 7,465,645 B2
(45) Date of Patent: Dec. 16, 2008

(54) METHOD OF DETACHING A LAYER FROM A WAFER USING A LOCALIZED STARTING AREA

(75) Inventors: Walter Schwarzenbach, Saint Nazaire les Eymes (FR); Christophe Maleville, La Terrasse (FR); Nadia Ben Mohamed, Renage (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 47 days.

(21) Appl. No.: 10/766,207

(22) Filed: Jan. 29, 2004

(65) Prior Publication Data

US 2005/0028727 A1 Feb. 10, 2005

(30) Foreign Application Priority Data

Aug. 4, 2003 (FR) .................................. 03 09597

(51) Int. Cl.
*H01L 21/46* (2006.01)
*H01L 21/30* (2006.01)

(52) U.S. Cl. .................... 438/458; 438/459; 438/528; 438/530; 438/799

(58) Field of Classification Search ................ 438/455, 438/458, 459, 799
See application file for complete search history.

(56) References Cited

U.S. PATENT DOCUMENTS

| | | | | |
|---|---|---|---|---|
| 5,374,564 | A | 12/1994 | Bruel | 437/24 |
| 5,920,764 | A * | 7/1999 | Hanson et al. | 438/4 |
| 6,013,563 | A | 1/2000 | Henley et al. | 438/458 |
| 6,048,411 | A | 4/2000 | Henley et al. | 148/33.5 |
| 6,100,165 | A | 8/2000 | Sakaguchi et al. | 438/455 |
| 6,150,239 | A | 11/2000 | Goesele et al. | 438/458 |
| 6,162,705 | A * | 12/2000 | Henley et al. | 438/478 |
| 6,372,609 | B1 | 4/2002 | Aga et al. | 438/459 |
| 6,391,799 | B1 | 5/2002 | Di Cioccio | 438/781 |
| 6,413,874 | B1 | 7/2002 | Sato | 438/714 |
| 6,500,732 | B1 | 12/2002 | Henley et al. | |
| 6,597,039 | B2 | 7/2003 | Ohmi et al. | |
| 6,756,286 | B1 * | 6/2004 | Moriceau et al. | 438/459 |
| 6,828,216 | B2 * | 12/2004 | Schwarzenbach et al. | 438/458 |

(Continued)

FOREIGN PATENT DOCUMENTS

DE 19747164 A1 10/1997

(Continued)

OTHER PUBLICATIONS

Chin Teng Lin et al., "Temperature Control Of Rapid Thermal Processing System Using Adaptive Fuzzy Network", Fuzzy Sets and Systems, vol. 103, pp. 49-65 (1999).

*Primary Examiner*—Zandra Smith
*Assistant Examiner*—Khanh B Duong
(74) *Attorney, Agent, or Firm*—Winston & Strawn LLP

(57) ABSTRACT

A method for detaching a layer from a wafer. A weakened zone is created in the wafer to define the layer to be detached and a remainder portion of the wafer, such that the weakened zone includes a main region and a localized super-weakened region that is more weakened than the main region. Detachment of the layer from the remainder portion of the wafer is initiated at the super-weakened region such that the detachment properties to the main region to detach the layer from the remainder portion.

16 Claims, 2 Drawing Sheets

U.S. PATENT DOCUMENTS

| | | | |
|---|---|---|---|
| 6,830,631 B2 | 12/2004 | Nenyei et al. | 134/37 |
| 6,846,718 B1 * | 1/2005 | Aga et al. | 438/406 |
| 6,911,376 B2 * | 6/2005 | Yoo | 438/455 |
| 2001/0001975 A1 | 5/2001 | Sakaguchi et al. | 156/239 |
| 2002/0056519 A1 | 5/2002 | Henley et al. | 156/344 |
| 2002/0102857 A1 | 8/2002 | Sato | 438/714 |
| 2002/0115264 A1 | 8/2002 | Henley et al. | 438/458 |
| 2003/0087503 A1 | 5/2003 | Sakaguchi et al. | |
| 2003/0234075 A1 | 12/2003 | Aspar et al. | |
| 2004/0137762 A1 | 7/2004 | Schwarzenbach et al. | 438/799 |

FOREIGN PATENT DOCUMENTS

| | | |
|---|---|---|
| DE | 100 08 829 B4 | 9/2001 |
| EP | 0 291 147 | 11/1988 |
| EP | 793 263 | 9/1997 |
| EP | 0793263 | 9/1997 |
| EP | 0 926 713 A2 | 6/1999 |
| EP | 938 129 | 8/1999 |
| EP | 0938129 | 8/1999 |
| EP | 0 948 032 A2 | 10/1999 |
| EP | 0 961 312 A2 | 12/1999 |
| EP | 0 533 551 B1 | 8/2000 |
| EP | 1 045 448 A1 | 10/2000 |
| EP | 1 100 127 A1 | 5/2001 |
| EP | 1 258 909 A2 | 11/2002 |
| EP | 1 256 973 B1 | 12/2004 |
| JP | 2000294754 A | 10/2000 |
| WO | WO 99/49501 | 9/1999 |
| WO | WO 01/63002 A1 | 8/2001 |
| WO | WO02/05344 | 1/2002 |
| WO | WO 02/05344 | 1/2002 |
| WO | WO 02/37556 A1 | 5/2002 |

\* cited by examiner

CREATING A WEAKENED ZONE IN A WAFER TO DEFINE THE LAYER TO BE DETACHED AND A REMAINDER PORTION OF THE WAFER SUCH THAT THE WEAKENED ZONE INCLUDES A MAIN REGION AND A LOCALIZED SUPER-WEAKENED REGION THAT IS MORE WEAKENED THAN THE MAIN REGION

INITIATING DETACHMENT OF THE LAYER FROM THE REMAINDER PORTION OF THE WAFER AT THE SUPER-WEAKENED REGION BY APPLYING A CONTROLLED DETACHMENT FORCE OBTAINED BY HEATING AT LEAST THE WEAKENED ZONE

FIGURE 4

METHOD OF DETACHING A LAYER FROM A WAFER USING A LOCALIZED STARTING AREA

FIELD OF THE INVENTION

The present invention relates to detaching a layer from a wafer, and more particularly to forming a weakened zone with a localized starting area to initiate the detachment.

BACKGROUND OF THE INVENTION

Methods of detachment of a layer from a wafer of material chosen from semiconductor materials is known, which includes:
  creating a zone of weakness in the thickness of the wafer that defines the layer to be detached in the thickness of the wafer, and
  subjecting the wafer to a treatment for effecting the detachment of the layer, at the level of the weakened zone.

These methods permit thin layers to be obtained with a thickness on the order of a micron or less. The layer may be of a semiconductor material such as silicon. The SMART-CUT® method of S.O.I.TEC Silicon On Insulator Technologies S.A., is an example of this type of method making use of such steps. It is generally desired that the surface of the detached layers generally conform to strict surface state specifications. It is common to find specifications for surface roughness not to exceed 5 angstroms in rms (root mean square) value. Roughness measurements are generally performed using an atomic force microscope (AFM). With this type of apparatus, roughness is measured on surfaces scanned by the point of the AFM microscope, from $1\times1$ $\mu m^2$ to $10\times10$ $\mu m^2$, and more rarely, $50\times50$ $\mu m^2$ or even $100\times100$ $\mu m^2$.

It is also possible to measure surface roughness by other methods, such as by using a measurement of "haze". This method has the advantage of permitting rapid characterization of the uniformity of roughness over the whole of a surface. The haze, measured in ppm, arises from a method using the optical reflectivity properties of the surface to be characterized, and corresponds to an optical "background noise" given off by the surface due to its micro-roughness.

It is also desirable that the roughness be as homogeneous as possible over the surface of the detached layer. Thus, similarly strict specifications may be associated with the remainder of the wafer after detachment (this remainder being termed the "negative"). It is possible to provide surface treatment steps after the detachment to attain these specifications. These treatments may, for example, make use of polishing, sacrificial oxidation, and/or supplementary annealing steps.

SUMMARY OF THE INVENTION

The present invention relates to a method of detaching a layer from a wafer, which preferably includes a crystal and is useful, for example, in micro electronics, optoelectronics, optics, or power electronics. In a preferred method, the weakened zone is created in the wafer, such that it defines the layer to be detached and a remainder portion of the wafer. Preferably, the weakened zone is disposed between the layer to be detached and the remainder portion. The weakened zone is created to include a main region and also a localized super-weakened region that is more weakened than the main region. Detachment of the layer from the remainder portion is initiated at the super-weakened region, such that the detachment propagates therefrom through the main region to detach the layer from the remainder portion. The preferred weakened zone extends through a crystalline layer of the wafer, and the wafer preferably comprises a semiconductor material.

The detachment is preferably initiated by applying a detachment force by way of a detachment process to the weakened zone that is sufficient to initiate detachment at the super-weakened region, but that is insufficient to initiate detachment of the main region without the prior initiation at the super-weakened region. The detachment force can be applied to both the super-weakened region and to the main region. Also, the detachment force can be obtained by applying energy to the weakened zone that is sufficient to initiate the detachment at the super-weakened region but not at the main region. Preferably, the energy is applied by heating the weakened zone, and the heating can be controlled for evening the heating applied to the weakened zone, preferably such that the heat is applied substantially evenly over substantially the entire weakened zone. The even heat can also be controlled to be applied over a major portion of the weakened zone. The heating of the weakened zone can include thermally annealing the wafer, and the heat can be applied using heating elements that can be independently controlled for evening the application of the heat to the weakened zone. Also, a heat-conducting gas can be flowed over the wafer during thermal annealing to facilitate that operation.

The weakened zone can be created by implanting atomic species in the wafer. In this case, the super-weakened region is preferably created by implanting an overdose of the atomic species compared to the dose thereof that is implanted in the main region. In one embodiment, the atomic species can be applied substantially in a single operation to the super-weakened and main regions. Alternatively, an initial dose similar to the dose of the main region can be applied to the majority or substantially all of the weakened zone, with the overdose being applied before or after the initial dose. Other methods of creating a weakened zone include producing a porous layer in the wafer.

BRIEF DESCRIPTION OF THE DRAWINGS

Other aspects, objects and advantages of the invention will become more apparent on reading the following description of a preferred embodiment of the invention, made with reference to the accompanying drawings, in which:

FIG. 4 is a flow chart of the process of the invention.

DETAILED DESCRIPTION OF THE PREFERRED EMBODIMENTS

Figure 1:
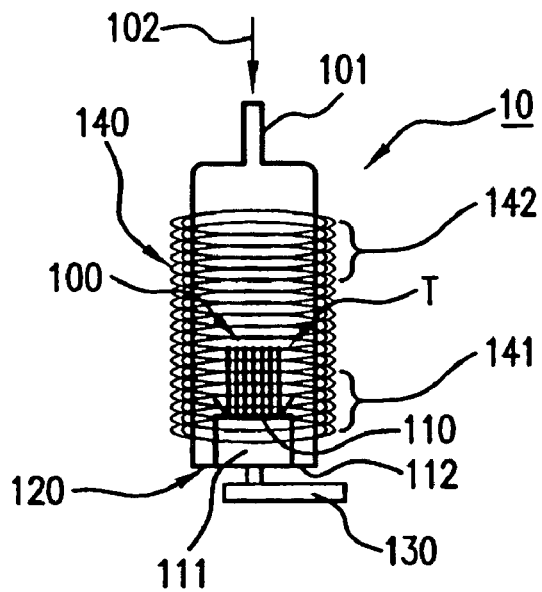
FIG. 1 is a schematic assembly diagram of a first embodiment of an annealing device used in accordance with the invention.

It is preferable to reduce the need for recourse to such complementary treatments, so as to simplify and accelerate the layer manufacturing process.

The invention thus provides a method of detachment of a layer from a wafer of material, which is preferably crystalline and more preferably of semiconductor material. One embodiment of the inventive method includes:
  creating a weakened zone in the thickness of the wafer to define in the thickness of the wafer the layer to be detached,
  subjecting the wafer to a treatment to detach the layer from the donor wafer, at the level of the weakened zone.

Preferably, during the creation of the weakened zone, a localized starting region of this zone is created. Preferably, the starting region is produced by creating a region within the weakened zone that has a localized degree of weakness. This starting region thus corresponds to a super-weakened zone of the weakened zone.

The primary process steps of the invention are illustrated in the flow diagram of FIG. 4. Preferred aspects of the inventive method include:

- a weakened zone created by implantation of atomic species, such as hydrogen ions or rare gas ions, and a starting zone created during the implantation by local implantation of an overdose of atomic species,
- the detachment treatment is preferably a thermal annealing,
- the preferred annealing is performed so as to apply to the wafer an amount of heat corresponding to the energy necessary for effecting the detachment,
- the preferred annealing is performed so as to apply to the wafer an amount of heat that is substantially homogeneous over the whole weakened embrittlement zone,
- different heating elements situated facing the wafer can be selectively controlled during the annealing in an embodiment of the invention,
- detachment is initiated at the starting region during annealing in the preferred embodiment,
- the detachment in this propagates from the starting zone over the whole extent of the weakened zone.

Creation of the Weakened Zone

A step of the preferred method includes creating a zone of weakness, within the thickness of a semiconductor material wafer. The zone of weakness defines the layer to be detached. The wafer may be, for example, of silicon.

In a preferred embodiment the weakened zone is created by implantation of atomic species. In the prior art, such implantation is usually performed so as to define a uniform concentration of implanted atomic species in the weakened zone.

This uniform implantation dose thus is the same for all the regions of the weakened zone.

In the preferred embodiment of the invention, this implantation is performed to totally create an implantation overdose in a predetermined region of the wafer. This region of the wafer will thus receive a greater dose of atomic species than the remainder of the wafer.

This local implantation overdose may be obtained by first implanting the wafer in a spatially homogeneous manner, and locally implanting an overdose into a desired region.

Alternatively, the species beam of an implanter can be displaced over the wafer surface, so as to sweep the surface of this wafer in a preselected manner, such that the kinematics of beam displacement over the wafer surface performs a spatially homogeneous implantation on the wafer surface, except for the desired specific region into which the overdose is implanted. The implanter emitting the species beam, for instance, can be immobilized for a time sufficient to create the overdose. In this configuration, the wafer can be fixed while the implanter beam is displaced. It is likewise possible to displace the wafer in a controlled manner, facing a fixed beam to achieve an implantation of the atomic species with the same distribution.

The weakened zone can thus be created to compromise a region that has a locally greater concentration of implanted species. This super-weakened region of increased weakness of the weakened zone has a greater weakness of the bond between the layer to be detached and the remainder of the wafer's super-weakened region thus corresponds to a starting region for the detachment of the layer bonding the zone of weakness. It is most preferred that this super-weakened region is produced at or near the periphery of the wafer.

The step of making the weakened zone has thus been performed to create in this zone a localized region where the weakened zone has a greater weakness, locally, so that this region corresponds to a super-weakened region of the weakened zone.

This super-weakened region establishes a "starting region", the meaning of which will become apparent hereinafter. The starting region of the embrittlement zone is localized. The starting region may, for example, be a region that covers an angular sector on the order of several degrees at the periphery of the embrittlement zone. It is likewise possible, in an alternative embodiment, to constitute this specific region mostly or all around the periphery of the wafer. In this case, the angular sector covered by the starting region may be as much as 360°. The width of this region having a ring shape is thus small, substantially less than one centimeter.

Treatment for Detachment

Once the weakened zone has been made with a starting region in the wafer, the wafer is subjected to a treatment for detachment of the layer, at the level of the weakened zone, from the remainder of the wafer.

PREFERRED EMBODIMENT

In the preferred embodiment of the invention, the weakened zone is formed by implantation with a local overdose, the treatment makes use of an annealing. This annealing causes coalescence of the micro-bubbles of implanted atomic species. This annealing is preferably effected under conditions that permit applying to the wafer as homogeneous an amount of heat as possible.

An effect is sought, in the case of the invention, such that during the annealing, detachment is locally initiated at the level of the starting region, to then propagate over the whole of the weakened zone so as to effect complete detachment. The Applicant has observed that, when subjecting wafers to detachment annealing in which the wafers are disposed at the center of heating elements all providing the same heating energy, the detachment was initiated at the level of "hot points" or "hot regions". These hot regions correspond to places in the weakened zone receiving a locally greater amount of heat because of temperature inhomogeneities in the furnace. The hot regions are typically situated in the upper region (in the vertical direction) of the wafer.

In the case of the present invention, this initiation of detachment is effected by the starting region, in particular permitting limiting the extent of the rough zone related to the detachment. This allows for suppressing or eliminating the hot regions.

Several solutions are possible for this purpose. FIG. 1 shows a first embodiment of an annealing device that may be used in the invention. The annealing applied to the wafers has as the purpose, for each wafer, to detach the layer of material defined within the thickness of the wafer by its weakened zone.

The device 10 of FIG. 1 comprises a heating enclosure 100 for receiving one or more wafers T to anneal them. The longitudinal axis of the device 10 is vertical, and this device 10 is of the vertical oven type. It will be noted that the wafers T are disposed vertically in this enclosure.

The wafers are received in a cage 110, which is itself supported by a support 111. The support 111 rests on a cover 112 closing the throat 120 of the device. A wafer handler 130 may furthermore be provided for introducing the wafers into the device 10 and removing them after annealing.

The enclosure 100 is provided with an aperture 101 situated opposite the throat 120. A heat-conducting gas 102 may be introduced into the enclosure through this aperture. A plurality of heating elements 140 surround the enclosure 100. These heating elements 140 are disposed sequentially stacked in a substantially vertical direction. These heating elements may for example be electrodes capable of emitting heat when they are supplied with electricity.

Figure 2:
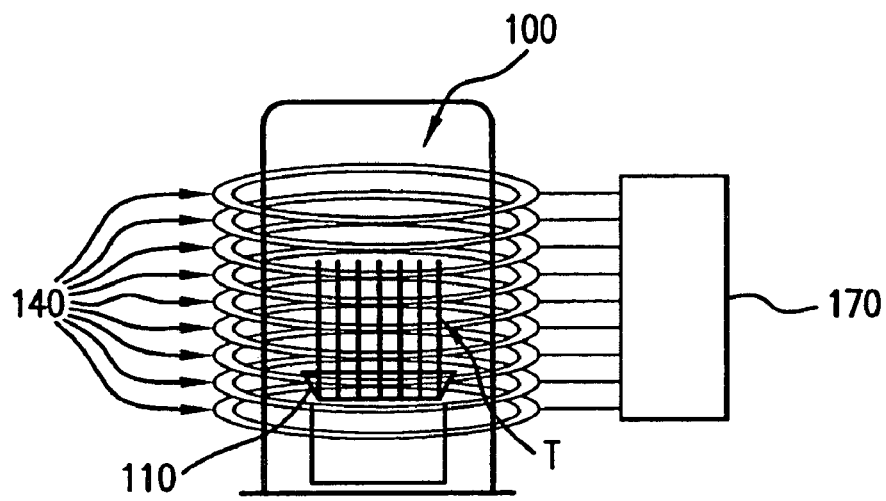
FIG. 2 is a detailed schematic diagram of a portion thereof.

FIG. 2 provides a view with more details of certain features of the enclosure 100, the wafers T, and the heating elements 140 (their number shown, being reduced in this figure for the sake of clarity). A heating controller 170 is associated with the heating elements 140, preferably for selectively controlling of the supply of each heating element, so as to selectively control the heating power of each of these elements 140. In this manner, the vertical distribution is controlled of the amount of heat applied to the wafers during heating.

The Applicant has in fact observed that the use of a conventional vertical oven with the wafers disposed vertically therein, produces a vertical temperature gradient. By selectively controlling the supply to the heating elements 140, however, a spatially homogeneous, evenly distributed amount of heat may be applied to the wafers T over substantially the entire weakened zone of each wafer. This can be visualized, for example, by measurements of haze produced on the surface of the layers after their detachment. Typically, the vertically lower heating elements 141 will be supplied with more power, more than the upper elements, so as to compensate for the natural tendency of heat to rise in the enclosure, which tends to produce higher temperatures in the upper portion of this enclosure. Thus, the global amount of heat applied to the wafers is substantially homogeneous over the entire weakened zone of each wafer.

The embodiment of FIGS. 1 and 2 corresponds to a preferred embodiment of an annealing device that may be used in the invention. It is also possible, however, to achieve such a homogeneous application of a global amount of heat using different embodiments.

Figure 3:
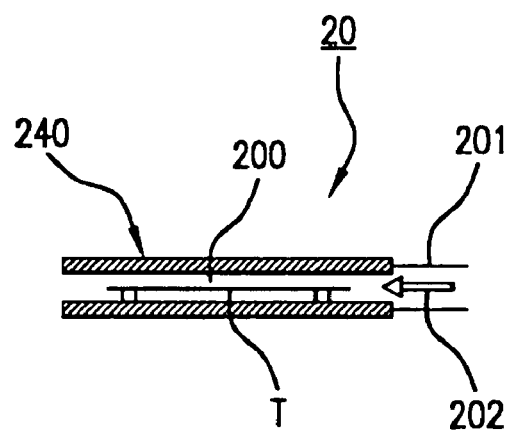
FIG. 3 is a schematic diagram of a second embodiment of an annealing device used according to the invention.

FIG. 3 shows a device 20 capable of performing an annealing procedure according to the invention on a wafer T, or on a plurality of wafers. The wafer(s) T extends substantially horizontally, in a heating enclosure 200. The enclosure 200 is provided with an aperture 201 for the introduction of a heat-conducting gas 202.

The device 20 has heating elements shown collectively by reference 240. These heating elements 240 may be disposed solely above the wafers, but it is also possible to provide additional heating elements, such as below the wafers. The heating elements 240 may be, for example, a series of individual heating elements (for example, electrodes or heating plates) extending in the same horizontal plane.

Each heating element 240 can then be a circular ring placed concentrically to the others, with the different elements having different diameters. The elements can be arranged concentrically with respect to the wafers T when the wafers T are in the annealing position.

A heating controller can be provided in this embodiment as well to selectively and individually control each heating element. Thus, the global amount of heat can be applied to the wafers homogeneously and substantially evenly over the weakened zone of the wafers T.

The heating elements 240 may likewise be a single electrode of the "heating plate" type, in which it is possible to control the temperature distribution. The heating elements 240 may alternatively be controlled infrared lamps, the respective supplies of which are individually controlled. Elements 240 of electrode type (for example, concentric circular rings) may be combined with infrared lamps, which provide supplementary heating capable of locally adjusting the amount of heat applied to the weakened zone to constitute a homogeneous global amount of heat. In any case, in all embodiments of the invention, the heating device is preferably capable of effecting substantially homogeneous heating of the wafers, so as to apply a homogeneous amount of heat to the weakened zone of these wafers.

In operation, the annealing device according to the invention thus applies a homogeneous amount of heat to the weakened zone of the wafers T. The amount of heat received by each wafer during this annealing preferably to and in at least the amount of energy necessary to detach the layer from the wafer. A local detachment of the layer at the starting region is preferably produced by the annealing. This initial detachment then spontaneously propagates over the whole weakened zone due to the sufficient amount of heat that is applied to the wafer.

The Applicant has observed that by proceeding in this manner a particularly low surface roughness of the detached layer is obtained. This roughness furthermore has improved homogeneity and is substantially homogenous. In contrast, in the case of using a conventional detachment annealing on a wafer with a weakened zone that does not have a starting region, the detachment is initiated during the annealing at the hot regions mentioned produced by uneven annealing heat distribution. In this conventional case, it is generally observed that the local roughness of the detached layer is greater near the level of the hot regions than the general layer surface roughness.

In the case of the preferred embodiment of the invention, this inhomogeneity of roughness is substantially reduced or avoided, particularly if the majority of the region of weakness is away from the starting region.

Thus, in a conventional version of the SMART-CUT® method, implantation is performed substantially uniformly over the surface of the wafer, and during the detachment annealing, the detachment is generally initiated by inhomogeneities of the amount of heat accidentally applied to the wafer.

In the preferred embodiment of the invention, on the contrary, a non-uniform implantation is performed with localized overdose, and as homogeneous an amount of heat as possible is sought to be applied to the wafer.

OTHER EMBODIMENTS

As mentioned, it is possible to employ the invention according to embodiments different from the preferred embodiment. In other embodiments, a starting region is created at the level of the weakened zone of the wafer. At the level of the starting region, the weakened zone between the layer to be detached and the remainder of the wafer is locally super-weakened so as to define a starting region. During the treatment to detach the layer from the wafer, this starting region will permit initiating detachment, so that this then propagates over the whole surface of the weakened zone.

The detachment treatment may in this case be effected by other processes, such as by mechanical impingement at the level of the starting region. One or more blades impinging on the peripheral belt of the wafer at the level of the starting region or a pressurized fluid jet may be utilized for this mechanical impingement.

In embodiments in which a region of weakness is produced, for example, to detach the assembled film from the donor substrate, the technique known as SMART-CUT® can be employed. In example of this technique, before bonding the donor substrate with a support substrate, atomic species, such as hydrogen or helium ions, are implanted in the donor substrate to produce the region of weakness at a depth close to, at, or around the depth of the implantation. Alternatively, the region of weakness can comprise a weak interface between the film and the remainder of the donor wafer by forming at least one porous layer by anodization or by another pore-forming technique, for example, as described in document EPO 849788 A2.

Energy is supplied to the region of weakness after bonding the donor substrate to the first substrate. The energy can be supplied by heat, as in the preferred embodiment, by mechanical treatment, or by another method, and is sufficient to detach the film from the remainder of the donor wafer in the region of weakness by initiating the detachment at the super-weakened region. Additionally, the donor wafer can be subjected to heat treatment during or after the implantation to further weaken the region of weakness.

A surface finishing technique can be carried out on the surface of the detached film or to the surface of a layer subsequently grown thereon. The surface finishing techniques can include, for example, selective chemical etching, CMP polishing, a heat treatment, or other smoothing operation. A finishing step such as an annealing operation can be carried out to strengthen the bond between the arranged layer of films and the first substrate.

While illustrative embodiments of the invention are disclosed herein, it will be appreciated that numerous modifications and other embodiments may be devised by those skilled in the art. Therefore, it will be understood that the appended claims are intended to cover all such modifications and embodiments that come within the spirit and scope of the present invention.

What is claimed is:

1. A method of detaching a layer from a wafer, which comprises:
    creating a weakened zone in a wafer to define the layer to be detached and a remainder portion of the wafer, such that the weakened zone includes a main region and a localized super-weakened region that is more weakened than the main region, wherein the super-weakened region is created by implanting an overdose of the atomic species compared to the dose of atomic species implanted in the main region; and
    initiating detachment of the layer from the remainder portion at the super-weakened region by applying a controlled detachment force obtained by heating at least the weakened zone wherein the heat is applied substantially evenly over substantially the entire weakened zone, and wherein the heating is controlled for evening the heating applied to weakened zone such that the detachment initiates and propagates from the super-weakened region through the main region to detach the layer from the remainder portion; and wherein the detachment force is applied to both the super-weakened region and the main region.

2. The method of claim 1, wherein the detachment force is obtained by applying energy to weakened zone.

3. The method of claim 1, wherein the heating of the weakened zone comprises thermally annealing the wafer.

4. The method of claim 1, wherein the weakened zone is created by implanting a dose of atomic species in the wafer.

5. The method of claim 1, wherein the atomic species is applied in substantially a single operation to both the super-weakened and main regions.

6. The method of claim 1, wherein an initial dose of atomic species is applied to the weakened zone, and the overdose is applied to the super-weakened region before or after the application of the initial dose.

7. The method of claim 1, wherein the weakened zone is created by producing a porous layer in the wafer.

8. The method of claim 1, wherein the weakened zone extends through a crystalline layer of the wafer.

9. The method of claim 1, wherein the wafer comprises a semiconductor material.

10. The method of claim 1, wherein the localized super-weakened region covers an angular sector on the order of several degrees at the periphery of the weakened zone.

11. A method of detaching a layer from a wafer, which comprises:
    creating a weakened zone in a wafer to define the layer to be detached and a remainder portion of the wafer, such that the weakened zone includes a main region and a localized super-weakened region that is more weakened than the main region, wherein the super-weakened region is created by implanting an overdose of the atomic species compared to the dose of atomic species implanted in the main region; and
    initiating detachment of the layer from the remainder portion at the super-weakened region to impart a controlled detachment force obtained by applying heat substantially evenly over substantially the entire weakened zone, and wherein the heating is controlled for evening the heating applied to the weakened zone such that the detachment initiates and propagates from the super-weakened region through the main region to detach the layer from the remainder portion,
    wherein the heat is applied by heating elements that are independently controlled for evening the application of heat to the weakened zone; and wherein the detachment force is applied to both the super-weakened region and the main region.

12. The method of claim 11, which further comprises flowing a heat conducting gas over the wafer during thermal annealing.

13. The method of claim 11, wherein the detachment is conducted under conditions sufficient to obtain a detached layer that is substantially homogenous and has a low surface roughness and improved homogeneity compared to the surface roughness and homogeneity obtained from a conventional detachment annealing on a wafer having a weakened zone but not a super-weakened region.

14. The method of claim 11, wherein the localized super-weakened region covers an angular sector on the order of several degrees at the periphery of the weakened zone.

15. A method of detaching a layer from a wafer, which comprises:
    creating an weakened zone in a wafer to define the layer to be detached and a remainder portion of the wafer, such that the weakened zone includes a main region and a localized super-weakened region that is more weakened than the main region, wherein the super-weakened region is created by implanting an overdose of the atomic species compared to the dose of atomic species implanted in the main region; and
    initiating detachment of the layer from the remainder portion at the super-weakened region by applying heat a controlled detachment force obtained by heating at least the weakened zone wherein the heat is applied substantially evenly over substantially the entire weakened zone, and wherein the heating is controlled for evening the heating applied to the weakened zone such that the detachment initiates and propagates from the super-weakened region through the main region to detach the layer from the remainder portion, wherein the detachment force is applied to both the super-weakened region and the main region to obtain a detached layer that is substantially homogenous and has a low surface roughness and improved homogeneity compared to the surface roughness and homogeneity obtained from a conventional detachment annealing on a wafer having a weakened zone but not a super-weakened region.

16. The method of claim 15, wherein the localized super-weakened region covers an angular sector at the periphery of the weakened zone.

* * * * *